United States Patent [19]
Kim et al.

[11] Patent Number: 5,604,448
[45] Date of Patent: Feb. 18, 1997

[54] OUTPUT BUFFER CIRCUIT HAVING LOW NOISE CHARACTERISTICS

[75] Inventors: Gyu S. Kim; Hoon M. Yoon, both of Kyoungkido, Rep. of Korea

[73] Assignee: Hyundai Electronics Industries Co., Ltd., Kyoungkido, Rep. of Korea

[21] Appl. No.: 523,307

[22] Filed: Sep. 5, 1995

[30] Foreign Application Priority Data

Sep. 9, 1994 [KR] Rep. of Korea ............... 1994-22784

[51] Int. Cl.⁶ .................................................. H03K 17/16
[52] U.S. Cl. .................................. 326/27; 326/33; 326/83
[58] Field of Search ................................ 326/21, 27, 30, 326/31, 33–34, 82–83, 86

[56] References Cited

U.S. PATENT DOCUMENTS

| | | | |
|---|---|---|---|
| 4,719,369 | 1/1988 | Asano et al. | 326/30 |
| 5,017,807 | 5/1991 | Kriz et al. | 326/27 |
| 5,124,579 | 6/1992 | Naghashinsh | 326/27 |
| 5,194,764 | 3/1993 | Yano et al. | 326/27 X |
| 5,315,187 | 5/1994 | Cheng | 328/27 X |
| 5,512,844 | 4/1996 | Nakakura et al. | 326/27 X |

*Primary Examiner*—David R. Hudspeth
*Attorney, Agent, or Firm*—Keck, Mahin & Cate

[57] ABSTRACT

Disclosed is an output buffer circuit having low noise characteristics, comprising a control section for detecting whether a driving voltage of more than a normal voltage is applied or not, and generating a control signal on the basis of detection result thereof; and a pull-up section for enabling a voltage down to be selectively caused between a driving voltage supplying terminal and an output terminal of said buffer circuit in response to said control signal. By the output buffer, it is possible to considerably reduce a ground bounce noise occurring upon a driving voltage of more than a normal voltage being applied. Thus, the total ground level of a semiconductor device, in which the output buffer is embodied, can be stabilized, and therefore stability of the device can be enhanced.

6 Claims, 2 Drawing Sheets

OUTPUT BUFFER CIRCUIT HAVING LOW NOISE CHARACTERISTICS

BACKGROUND OF THE INVENTION

1. Field of the Invention

The present invention relates to an output buffer circuit to be embodied in a semiconductor device and, more particularly, to an output buffer circuit having low noise characteristics, in which a ground bounce noise can be minimally generated.

2. Description of the Prior Art

In general, since a ground bounce noise makes electric potential of a ground terminal in a semiconductor device to be instable, it lowers the performance of overall circuit elements provided in the device.

Prior art output buffer adapted to describe such a ground bounce noise is shown in FIGS. 1 and 2. FIG. 1 is a schematic circuit diagram of a prior art output buffer.

As shown in FIG. 1, the prior art output buffer is constituted by two transistors each having a gate for receiving a signal S/A from a sense amplifier (not shown), one of which is a pull-up PMOS (P-channel Metal Oxide Silicon) transistor, and the other of which is a pull-down NMOS (N-channel Metal Oxide Silicon) transistor.

Equivalent circuit of the prior art output buffer is shown in FIG. 2. As shown in this drawing, a capacitance C is formed at the output terminal of the buffer, and inductances L1 and L2 are formed at the pull-up and pull-down transistors, respectively. In the construction of the buffer, a constant voltage $V_{out}$ is charged in the capacitance C during pull-up operation thereof, and a current flowing through the NMOS transistor is in proportion to the charged voltage $V_{out}$ during pull-down operation thereof. For example, relation between a driving voltage $V_{DD}$ and a magnitude of the current I flowing during the pull-down operation can be expressed by following formula:

$$I = C \cdot \frac{dV_{out}}{dt}$$

As can be seen from the formula, the current I is in proportion to the voltage $V_{out}$. Then, a voltage $V_{GB}$ between both ends of the inductance L2 formed at the NMOS transistor, i.e. a ground bounce voltage, causes a noise to make the level of total grounds of the semiconductor device instable, as given by following formula.

$$V_{GB} = L2 \cdot \frac{dI}{dt}$$

In the prior art output buffer having a PMOS transistor serving as a pull-up transistor, however, when a driving voltage is more than a normal voltage, the amount of a current flowing through a pull-down PMOS transistor is increased during pull-down operation thereof, as can seen from the above formulas. Thus, a ground bounce voltage is also increased enough to cause a significantly heighten noise.

SUMMARY OF THE INVENTION

It is an object of the present invention to provide an output buffer having low noise characteristics, in which, when a driving voltage of a semiconductor device is more than a normal voltage, a pull-up charging voltage is lowered to minimize a noise occurring due to a ground bounce voltage, and thus level of total grounds of the device is possible to be stable.

According to the aspect of the present invention, the output buffer circuit having a pull-down transistor, comprising means for detecting whether a driving voltage of more than a normal voltage is applied or not, and generating a control signal on the basis of detection result thereof; and pull-up means for enabling a voltage down to be selectively caused between a driving voltage supplying terminal and an output terminal of said buffer circuit in response to said control signal.

In the buffer circuit, said pull-up means comprises load means, a PMOS transistor, and selecting means for enabling said load means to be pull-up operated so as to cause said voltage down in response to said control signal from the controlling means, or said PMOS transistor to be pull-up operated so as not to cause said voltage down.

In the buffer circuit, said load means comprises an NMOS transistor to be pull-up operated in response to said control signal from the controlling means.

In the buffer circuit, said selecting means comprises first switching means for connecting a first data input terminal to a gate of said PMOS transistor; and second switching means for connecting a second data input terminal to a gate of said NMOS transistor of said load means.

In the buffer circuit, said selecting means further comprises means for turning off either said PMOS transistor or said load means in order that data to be applied to said first data input terminal or said second data input terminal does not exert an influence upon either said PMOS transistor or said load means.

In the buffer circuit, said controlling means comprises detection means for detecting said driving voltage of more than a normal voltage to generate an output signal; means for comparing said output signal with a reference voltage and generating said control signal on the basis of comparison result thereof.

In the buffer circuit, said controlling means further comprises means for generating a predetermined value as said control signal in response to a chip selecting signal to be externally applied.

In the buffer circuit, said detection means comprises at least one a pull-up PMOS transistor in which a gate and a drain thereof are circuit-shorted.

BRIEF DESCRIPTION OF THE DRAWINGS

This invention may be better understood and its object will become apparent to those skilled in the art by reference to the accompanying drawings as follows.

DESCRIPTION OF THE PREFERRED EMBODIMENT

Figure 1:
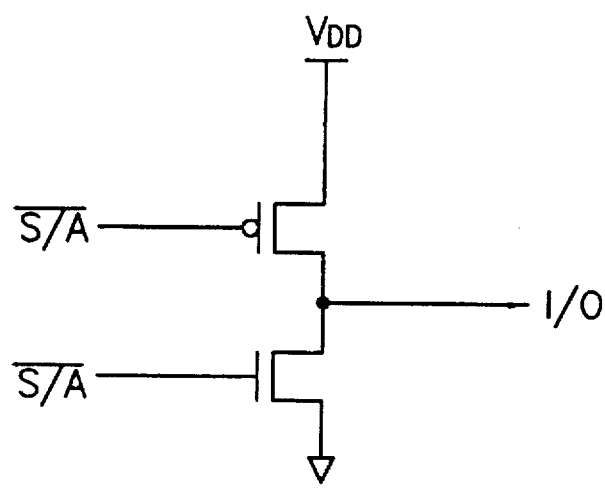
FIG. 1 is a schematic circuit diagram of a prior art output buffer.
Figure 2:
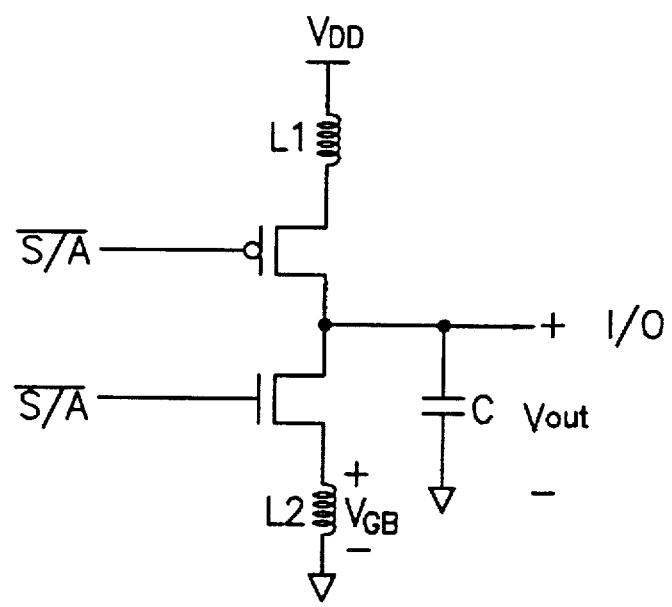
FIG. 2 is an equivalent circuit diagram of the prior art output buffer shown in FIG. 1.
Figure 3:
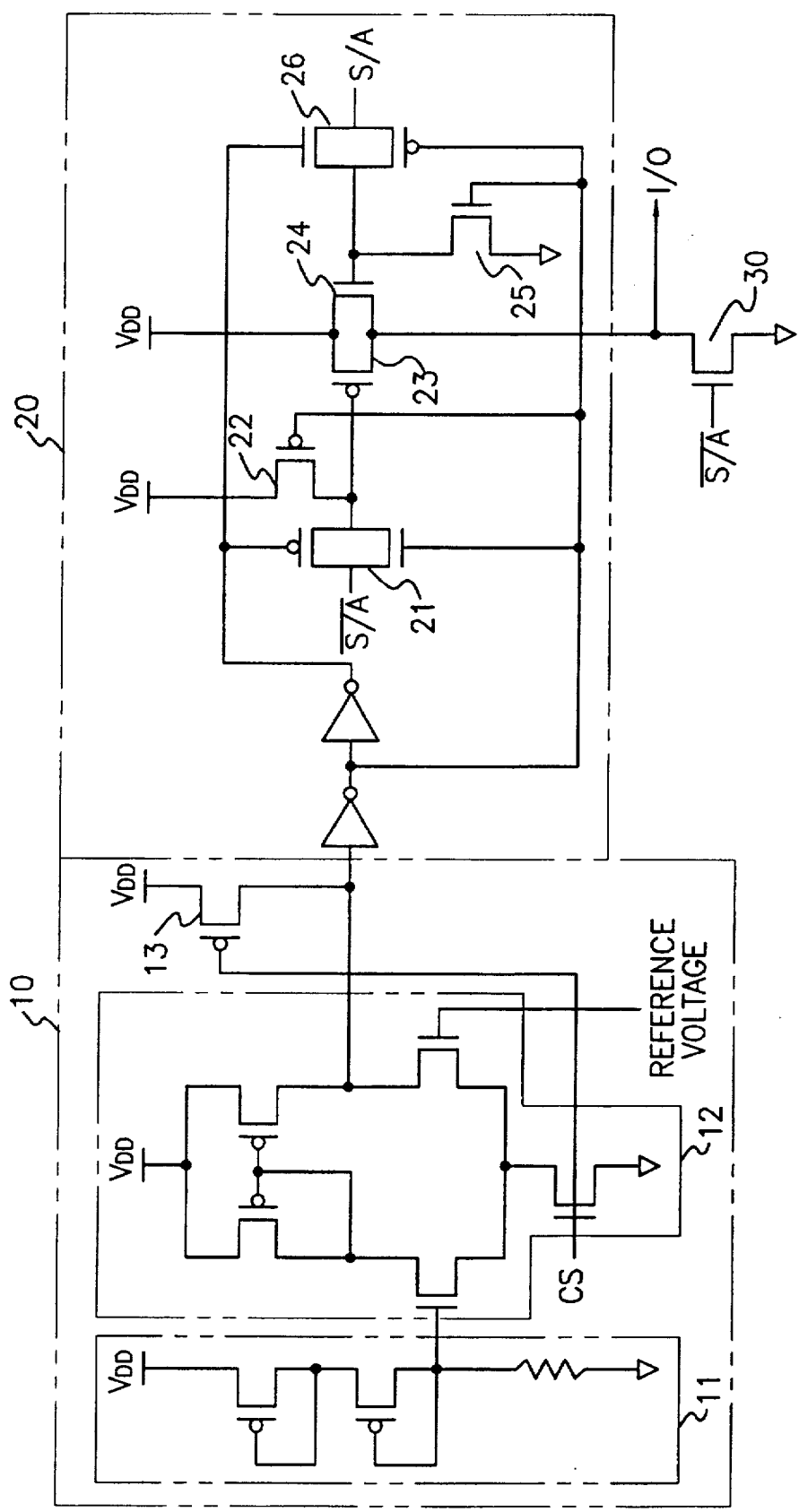
FIG. 3 is a circuit diagram showing the construction of an output buffer in accordance with the embodiment of the present invention.

Referred to FIG. 3, the novel output buffer in accordance with the present invention is broadly constituted by a control section 10, a pull-up section 20 and a pull-down NMOS transistor 30. The control section 10 detects whether a driving voltage $V_{DD}$ of more than a normal voltage is applied or not, and generates a control signal on the basis of detection result thereof. The pull-up section 20 has PMOS and NMOS transistors 23 and 24 which are functioned as a pull-up transistor in response to the control signal from the control section 10.

If the control section 10 detects that a driving voltage of more than a normal voltage is supplied, the NMOS transistor 24 is operated as the pull-up transistor. If not, the PMOS transistor 23 is operated as the pull-up transistor.

The pull-down NMOS transistor 30 receives an output signal S/A of a sense amplifier (not shown) through a gate thereof and performs a pull-down operation thereof.

As shown in FIG. 3, the control section 10 has a detecting portion 11, a comparing portion 12 and a PMOS transistor 13.

The detecting portion 11 detects whether the driving voltage $V_{DD}$ of more than the normal voltage is applied or not, and generates a detection signal when the driving voltage is more than the normal voltage. The detecting portion 11 has two PMOS transistors serving as a pull-up circuit and a resistor as serving as a pull-down circuit. The two PMOS transistors are serially connected with each other. Each of the two PMOS transistors has a gate and drain which are circuit-shorted. If the driving voltage of more than the normal voltage is applied, the detecting portion 11 generates a signal having a value of $V_{DD}-2V_{TP}$, where $V_{TP}$ is a threshold voltage of the PMOS transistor having circuit-shorted gate and drain.

The comparing portion 12 compares the output signal of the detecting portion 11 with a reference voltage in response to a chip selecting signal CS. In the embodiment, the comparing portion 12 is constituted by a differential amplifier. Thus, if the output signal of the detecting portion 11 is greater than the reference voltage, the differential amplifier generates a high level signal as a control signal. If the output signal thereof is less than the reference voltage, the amplifier generates a low level signal as the control signal. For reference, the reference voltage is predetermined in accordance with a designer's demand or a user's demand, and is provided to reduce a ground bounce noise, which is increased as the driving voltage is increased.

The PMOS transistor 13 is turned on in response to the chip selecting signal CS to generate the control signal of high level. In detail, the PMOS transistor 13 is turned on in accordance with the operation of the comparing portion 12. The PMOS transistor 13 is provided to generate the control signal of high level, when the comparing portion 12 is not operated.

On the other hand, the pull-up section 20 has a first PMOS transistor 23, a first NMOS transistors 24, a pair of switches 21 and 26, a second PMOS transistor 22 for turning-off the first PMOS transistor 23 when the control signal is high level, and a second NMOS transistor 25 for turning-off the first NMOS transistor 24 when the control signal is low level.

In this embodiment having the above construction, the PMOS transistor 23 serves as a pull-up transistor at a normal driving voltage $V_{DD}$ when a ground bounce noise is scarcely ever generated. If a driving voltage $V_{DD}$ of more than the normal voltage, however, is applied due to increase in the ground bounce noise, the NMOS transistor 24 is driven as a pull-up transistor.

Then, if the NMOS transistor 24 is driven as a pull-up transistor, the pull-up charging voltage becomes a voltage of $V_{DD}-V_{TH}$, where $V_{TH}$ is a threshold voltage of the NMOS transistor 24. Therefore, the ground bounce noise is relatively reduced owing to decrease in the pull-up charging voltage.

As described above, the output buffer according to the present invention allows to considerably reduce a ground bounce noise occurring upon a driving voltage of more than a normal voltage being applied. Thus, the total ground level of a semiconductor device, in which the output buffer is embodied, can be stabilized, and therefore stability of the device can be enhanced.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. An output buffer circuit having a pull-down transistor, said circuit comprising:

controlling means for detecting whether a driving voltage of more than a normal voltage is applied or not, and generating a control signal on the basis of detection result thereof;

pull-up means for enabling a voltage down between a driving voltage supplying terminal and an output terminal of said buffer circuit in response to said control signal; and selecting means for enabling said voltage down to be selectively alternated through a PMOS transistor or an NMOS transistor in response to said control signal.

2. The buffer circuit as defined in claim 1, wherein said selecting means comprises first switching means for connecting a first data input terminal to a gate of said PMOS transistor; and second switching means for connecting a second data input terminal to a gate of said NMOS transistor of said load means.

3. The buffer circuit as defined in claim 2, wherein said selecting means further comprises means for turning off either said PMOS transistor or said NMOS transistor in order that data to be applied to said first data input terminal or said second data input terminal does not exert an influence upon either said PMOS transistor or said NMOS transistor.

4. The buffer circuit as defined in claim 3, wherein said controlling means comprises detection means for detecting said driving voltage of more than a normal voltage to generate an output signal; means for comparing an output signal with a reference voltage and generating said control signal on the basis of comparison result thereof.

5. The buffer circuit as defined in claim 4, wherein said controlling means further comprises means for generating a predetermined value as said control signal in response to a chip selecting signal to be externally applied.

6. The buffer circuit as defined in claim 5, wherein said detection means comprises at least one a pull-up PMOS transistor in which a gate and a drain thereof are circuit-shorted.

* * * * *